(12) United States Patent
Sharma et al.

(10) Patent No.: US 12,532,526 B2
(45) Date of Patent: *Jan. 20, 2026

(54) METALLIC SEALANTS IN TRANSISTOR ARRANGEMENTS

(71) Applicant: Intel Corporation, Santa Clara, CA (US)

(72) Inventors: Abhishek A. Sharma, Hillsboro, OR (US); Tahir Ghani, Portland, OR (US); Jack T. Kavalieros, Portland, OR (US); Gilbert W. Dewey, Beaverton, OR (US); Van H. Le, Beaverton, OR (US); Lawrence D. Wong, Beaverton, OR (US); Christopher J. Jezewski, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 309 days.

This patent is subject to a terminal disclaimer.

(21) Appl. No.: 17/821,209

(22) Filed: Aug. 22, 2022

(65) Prior Publication Data

US 2022/0406907 A1 Dec. 22, 2022

Related U.S. Application Data

(63) Continuation of application No. 15/899,590, filed on Feb. 20, 2018, now Pat. No. 11,522,059.

(51) Int. Cl.
*H10D 64/23* (2025.01)
*H01L 23/29* (2006.01)
(Continued)

(52) U.S. Cl.
CPC ......... *H10D 64/251* (2025.01); *H01L 23/293* (2013.01); *H10D 30/60* (2025.01);
(Continued)

(58) Field of Classification Search
CPC ............. H01L 29/41725; H01L 23/293; H01L 29/42384; H01L 29/45; H01L 29/4908; H01L 29/66969; H01L 29/78; H01L 29/7869; H01L 29/22; H01L 29/24; H01L 29/242; H01L 29/41733; H01L 29/458; H01L 29/78648; H01L 29/78681; H01L 29/49; H01L 29/4966; H01L 29/41; H01L 29/7686; H10D 64/251; H10D 30/60; H10D 30/673; H10D 30/6739; H10D 30/6755; H10D 64/62; H10D 99/00; H10D 62/80;
(Continued)

(56) References Cited

U.S. PATENT DOCUMENTS 6,340,963 B1 * 1/2002 Anno ................ G02F 1/136204
345/206
11,522,059 B2 * 12/2022 Sharma ................... H01L 29/78
(Continued)

*Primary Examiner* — Thanhha S Pham
(74) *Attorney, Agent, or Firm* — Akona IP PC

(57) ABSTRACT

Disclosed herein are transistor electrode-channel arrangements, and related methods and devices. For example, in some embodiments, a transistor electrode-channel arrangement may include a channel material, source/drain electrodes provided over the channel material, and a sealant at (Continued)

least partially enclosing one or more of the source/drain electrodes, wherein the sealant includes one or more metallic conductive materials.

23 Claims, 9 Drawing Sheets

(51) Int. Cl.
  *H10D 30/60* (2025.01)
  *H10D 30/67* (2025.01)
  *H10D 62/80* (2025.01)
  *H10D 62/86* (2025.01)
  *H10D 64/62* (2025.01)
  *H10D 99/00* (2025.01)

(52) U.S. Cl.
  CPC ....... *H10D 30/673* (2025.01); *H10D 30/6739* (2025.01); *H10D 30/6755* (2025.01); *H10D 64/62* (2025.01); *H10D 99/00* (2025.01); *H10D 62/80* (2025.01); *H10D 62/86* (2025.01); *H10D 62/871* (2025.01)

(58) Field of Classification Search
  CPC .. H10D 62/86; H10D 62/871; H10D 30/6734; H10D 30/6729; H10D 30/6737; H10D 30/6743; H10D 30/675; H10D 64/20; H10D 64/66; H10D 64/667
  See application file for complete search history.

(56) References Cited

U.S. PATENT DOCUMENTS

| | | | |
|---|---|---|---|
| 2003/0102475 A1* | 6/2003 | Kwon | H01L 24/11 257/48 |
| 2010/0090309 A1* | 4/2010 | Rocklein | H01L 21/022 257/532 |
| 2010/0163868 A1* | 7/2010 | Yamazaki | H10D 86/60 257/E29.094 |
| 2014/0197377 A1* | 7/2014 | Kim | H01L 29/0676 257/29 |
| 2014/0225106 A1* | 8/2014 | Lee | H01L 21/02381 257/43 |
| 2016/0197192 A1* | 7/2016 | Kang | H01L 21/76852 257/43 |

* cited by examiner

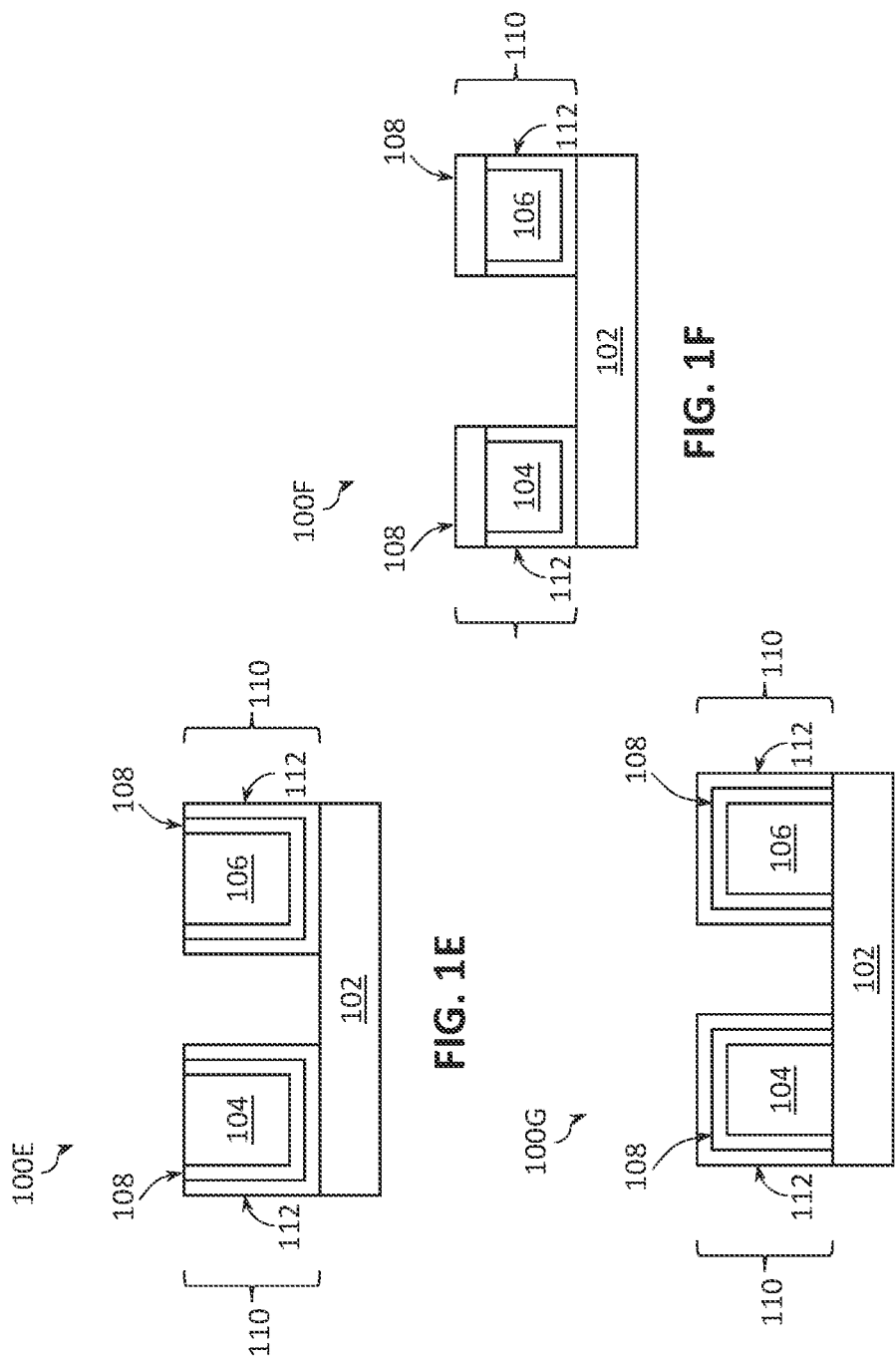

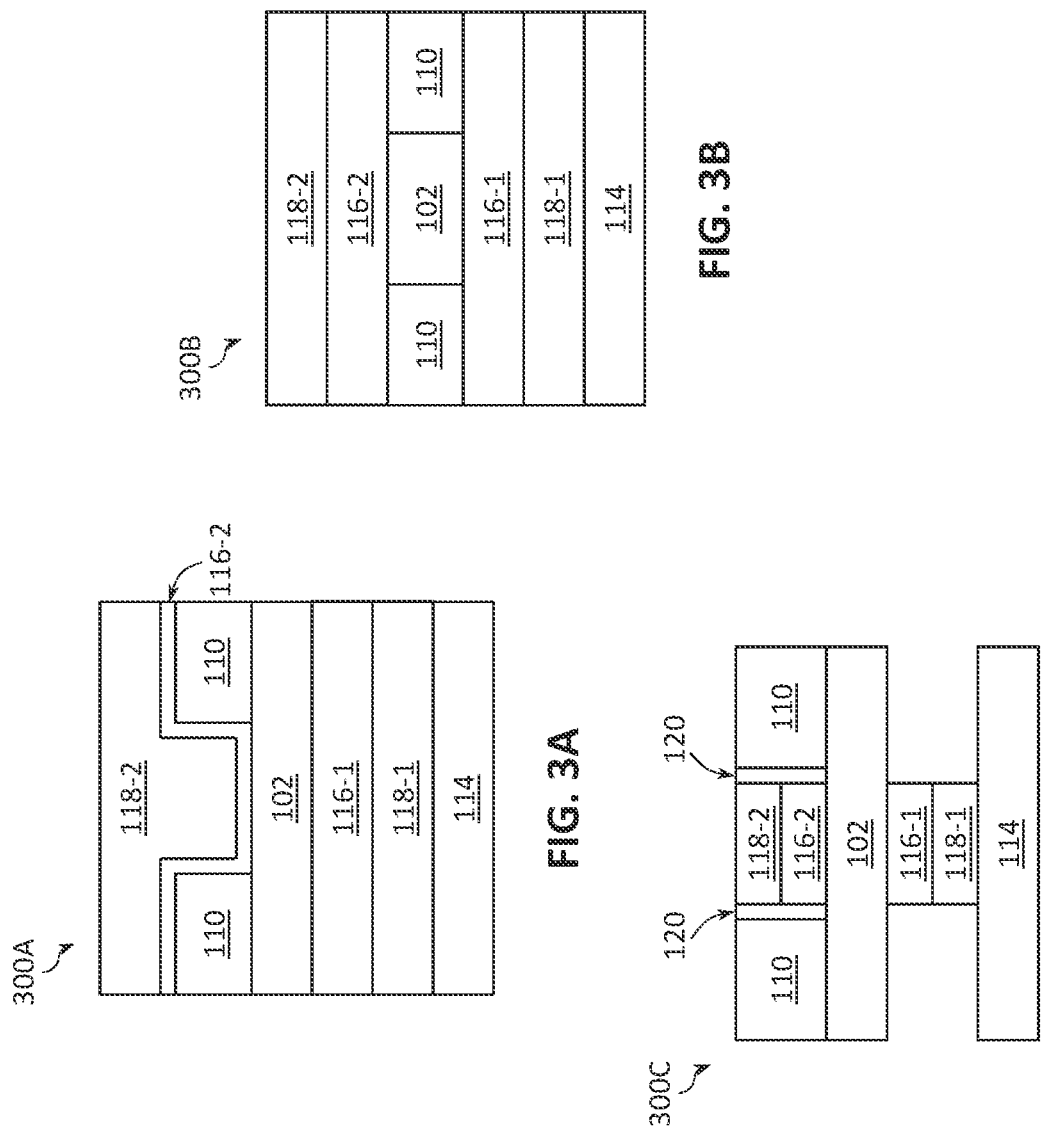

METALLIC SEALANTS IN TRANSISTOR ARRANGEMENTS

CROSS-REFERENCE TO RELATED APPLICATIONS

This application is a continuation and claims the benefit of priority under 35 U.S.C. § 120 of U.S. application Ser. No. 15/899,590, filed Feb. 20, 2018, and entitled METALLIC SEALANTS IN TRANSISTOR ARRANGEMENTS. The disclosure of the prior application is considered part of and is incorporated by reference in the disclosure of this Application.

TECHNICAL FIELD

This disclosure relates generally to the field of semiconductor devices, and more specifically, to transistors.

BACKGROUND

A thin-film transistor (TFT) is a special kind of a field-effect transistor that may be made by depositing a thin film of an active semiconductor material, as well as a dielectric layer and metallic contacts, over a supporting, typically non-conducting, substrate. This is different from conventional, non-thin-film transistors, in which the active semiconductor material is typically a part of the substrate, e.g., a silicon wafer.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 1A-1G provide cross-sectional side views of transistor source/drain (S/D) electrode-channel arrangements having S/D electrodes sealed with metallic conductive sealants, according to various embodiments of the present disclosure.

FIGS. 3A-3C provide cross-sectional side views of example double-gate transistors having S/D electrodes sealed with metallic conductive sealants, according to various embodiments of the present disclosure.

DETAILED DESCRIPTION

Figure 1A:
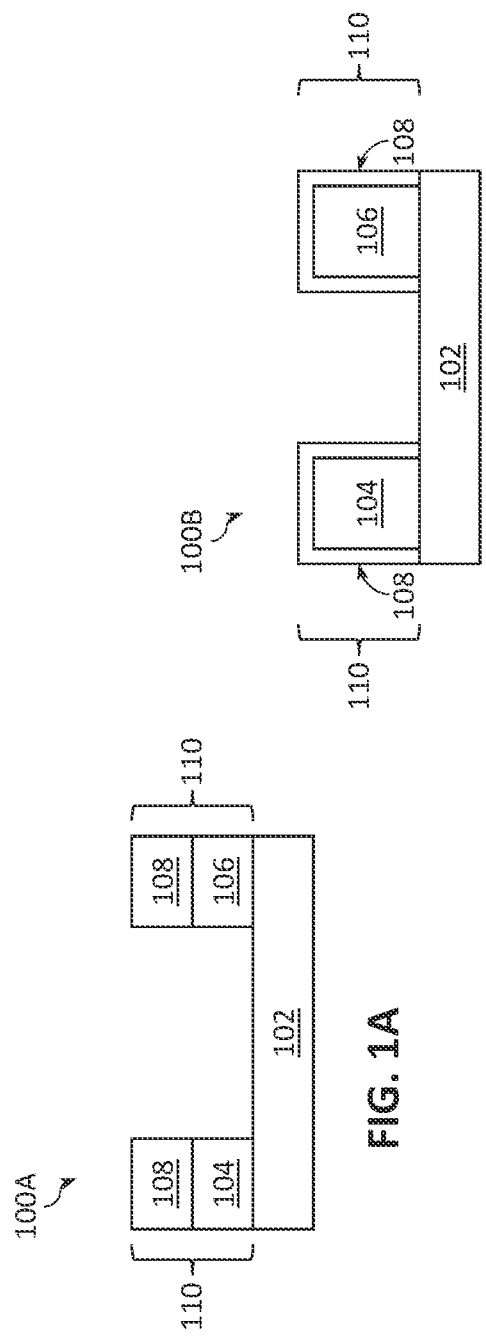

Disclosed herein are transistor source/drain (S/D) electrode-channel arrangements, and related methods and devices. For example, in some embodiments, a transistor S/D electrode-channel arrangement may include a channel material, S/D electrodes provided over the channel material, and a sealant at least partially enclosing one or more of the source/drain electrodes, wherein the sealant includes one or more metallic conductive materials.

The performance of a TFT may depend on the number of factors. For example, the efficiency at which a TFT is able to operate may depend on the quality of its S/D electrodes (which may, interchangeably, be referred to as "S/D terminals"). Atoms and molecules of ambient gases or/and of further metal layers within a transistor may make their way into the S/D electrodes, compromising the quality of S/D electrodes and negatively impacting transistor performance.

The transistor S/D electrode-channel arrangements disclosed herein include a metallic conductive sealant material, which could include multiple layers of different such materials, at least partially enclosing at least one, but typically both, of the S/D electrodes. The use of metallic conductive sealants to enclose at least portions of the S/D electrodes of a transistor (in particular, of a TFT transistor) may achieve one or more of a number of advantages. Materials which are both metallic (i.e., include one or more metals or one or more alloys of different metals) and electrically conductive provide a unique advantage over conventional sealants used in TFTs, such as insulating oxide or polymer sealants, in that they have an improved ability to reduce infiltration of not only oxygen but also hydrogen into the S/D electrodes. In some implementations, the S/D electrode-channel arrangements disclosed herein enable the use of a wider array of TFT S/D electrode materials, while achieving desirable performance, than realizable using conventional approaches.

While some descriptions are provided with reference to TFTs, at least some teachings of the present disclosure may be applicable to transistors that are not thin-film transistors; such transistors may employ S/D electrodes sealed with a metallic conductive sealant as described herein, all of which are within the scope of the present disclosure.

Transistor arrangements with sealed S/D electrodes as described herein may be implemented in one or more components associated with an integrated circuit (IC) or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g., FIGS. 1A-1G, such a collection may be referred to herein without the letters, e.g., as "FIG. 1."

In the drawings, some schematic illustrations of exemplary structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

In the following detailed description, various aspects of the illustrative implementations will be described using terms commonly employed by those skilled in the art to convey the substance of their work to others skilled in the art. For example, the terms "oxide," "carbide," "nitride," etc. refer to compounds containing, respectively, oxygen, carbon, nitrogen, etc. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

FIGS. 1A-1G provide cross-sectional side views of transistor S/D electrode-channel arrangements having S/D electrodes sealed with metallic sealants, according to various embodiments of the present disclosure. Applicable to all embodiments of the arrangements shown in FIGS. 1A-1G, the arrangements include a channel material 102, a first S/D electrode 104 (e.g., a source electrode), a second S/D electrode 106 (e.g., a drain electrode), and a sealant 108. In some embodiments, an optional low resistance contact material 112 may be present as well, e.g., as shown in FIGS. 1E-1G. In the following, a combination of S/D electrodes 104, 106, the sealant 108 and, when used, the low resistance contact material 112 is referred to as "sealed S/D electrodes" 110.

The channel material 102 may be composed of semiconductor material systems including, for example, N-type or P-type materials systems. In some embodiments, the channel material 102 may include a high mobility oxide semiconductor material, such as tin oxide, antimony oxide, indium oxide, indium tin oxide, titanium oxide, zinc oxide, indium zinc oxide, indium gallium zinc oxide, gallium oxide, titanium oxynitride, ruthenium oxide, or tungsten oxide. In general, the channel material 102 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, indium gallium zinc oxide (IGZO), indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In some embodiments, the channel material 102 may have a thickness between about 5 and 30 nanometers, including all values and ranges therein.

The S/D electrodes 104, 106, where designation of which electrode is a "source" electrode and which electrode is a "drain" electrode may vary, may include any suitable electrically conductive material, alloy, or a stack of multiple electrically conductive materials. In some embodiments, the S/D electrodes 104, 106 may include one or more metals or metal alloys, with metals e.g., copper, ruthenium, palladium, platinum, cobalt, nickel, hafnium, zirconium, titanium, tantalum, and aluminum, tantalum nitride, titanium nitride, tungsten, doped silicon, doped germanium, or alloys and mixtures of these. In some embodiments, the S/D electrodes 104, 106 may include one or more electrically conductive alloys, oxides, or carbides of one or more metals. In some embodiments, the S/D electrodes 104, 106 may have a thickness between about 2 nanometers and 1000 nanometers, preferably between about 2 nanometers and 100 nanometers.

The sealant 108 may be a metallic conductive sealant, i.e., may be or include one or more materials with are both metallic and electrically conductive. Examples of metallic conductive materials which may be used, either alone or in combination (e.g., as multiple layers of different materials), as the sealant 108 include 1) metallic conductive oxides (e.g., aluminum titanium oxide, indium tin oxide, degenerately doped IGZO, zinc oxide, indium oxide (In2O3), copper (I, II) oxide), 2) metallic conductive nitrides (e.g., titanium nitride, aluminum titanium nitride, tantalum nitride, aluminum tantalum nitride, or aluminum nitride), 3) single-element metals or metal compounds different from those of the metals of the S/D electrodes 104, 106 (e.g., palladium, tantalum, iron, nickel, cobalt, platinum, iridium, ruthenium, hafnium, niobium, molybdenum, copper, tungsten, degenerately doped silicon, germanium, silicon germanium, indium arsenide, indium phosphite, aluminum gallium arsenide, titanium chromium, cobalt iron boron, etc.), 4) various mixtures of metallic conductive oxides (e.g., a mixture of aluminum-doped zinc oxide (AZO), indium zinc oxide (IZO), indium tin oxide (ITO), indium gallium zinc tin oxide (IGZTO), aluminum gallium zinc oxide (AGZO), etc.), 5) various mixtures of metallic conductive nitrides (e.g., a mixture of aluminum titanium nitride, aluminum silicon nitride, gallium aluminum nitride, gallium tungsten nitride, aluminum tantalum nitride, tantalum titanium nitride, tantalum tungsten nitride, titanium tungsten nitride, etc.), 6) various mixtures of metallic conductive oxides and metallic conductive nitrides (e.g., a mixture of any of the metallic conductive oxides and metallic conductive nitrides listed above, in particular a mixture of ITO and one or more of tantalum nitride, titanium nitride, tantalum aluminum nitride, titanium aluminum nitride, aluminum silicon nitride, as well as mixtures of any other metallic conductive nitrides with ITO), and 7) conductive compounds, alloys and mixtures such as tungsten silicon, tungsten germanium, aluminum silicon, aluminum germanium, aluminum silicon germanium, tungsten silicon germanium, silicon titanium nitride, silicon tantalum nitride, germanium tantalum nitride, germanium titanium nitride, titanium aluminum carbide, tungsten carbide, titanium carbide, tantalum aluminum carbide, tantalum tungsten carbide, tantalum carbide, silicon carbide, silicon aluminum carbide, silicon tungsten carbide, cobalt iron boride, tungsten boride, nickel platinum, cobalt silicon, cobalt germanium, silicon platinum, germanium platinum, germanium titanium, germanium telluride, germanium antimony telluride, silicon telluride arsenic germanium, silicon telluride, silicon antimony telluride, cobalt tantalum carbide, cobalt tantalum nitride, tungsten tantalum carbide, tungsten tantalum nitride, etc.

In some embodiments, one or more materials of the sealant 108 are such that, overall, the sealant 108 has a relatively low permeability coefficient with respect to both oxygen and hydrogen. As used herein, the term "permeability coefficient" of a certain element, e.g., oxygen permeability or a hydrogen permeability, refers to a measure of the ability of the total materials of the sealant 108 to allow that element, e.g., oxygen or hydrogen, to pass through it. A high permeability coefficient will allow the element, e.g., oxygen or hydrogen, to move rapidly through the sealant 108. A low permeability coefficient will impede movement of the element through the sealant 108. The permeability of the sealant 108 may be related to its porosity, as well as to the shapes of the pores and to how connected they are. In various embodiments, an oxygen permeability coefficient of the sealant 108 (i.e., a total of the materials included in the sealant 108) may be below about $10^{-4}$ mole per millisecond Pascal (mol/ms-Pa), including all values and ranges therein, e.g., about $10^{-4}$ to $10^{-20}$ mol/ms-Pa, e.g., below about $10^{-13}$ mol/ms-Pa. In various embodiments, a hydrogen permeability coefficient of the sealant 108 may be in the same ranges.

In other embodiments, requirements on the hydrogen permeability coefficient of the sealant 108 may be somewhat relaxed, e.g., the sealant 108 may have a hydrogen permeability coefficient above $10^{-4}$ mol/ms-Pa, if the sealant 108 may be classified as a "highly amorphous" material. As is known in the art, materials in a single crystal form (also referred to as "monocrystalline solids") are materials in which the crystal lattice of the entire sample is substantially continuous and unbroken to the edges of the sample, with no grain boundaries. An opposite of a monocrystalline solid is a fully amorphous material (i.e., no crystallinity at all). In between fully amorphous (no crystallinity) and single crystalline materials (100% single phase single orientation long range order with substantially zero imperfections) there is a wide spectrum of materials with varying level of crystallinity. As used herein, the term "highly amorphous" refers to the materials at least 80% of which is in an amorphous form (or, from the other side, materials at most 20% of which is in a single crystal/monocrystalline form). Such materials may be amorphous because they include defects (e.g., dislocations, grain boundaries, etc.), polycrystals, or other imperfections/issues which negatively impact crystallinity. Some examples of highly amorphous materials that are metallic and conductive and, therefore, may be used as the sealant 108, include certain conductive oxides, metallic compounds, metals and metal alloys, such as platinum, iridium, molybdenum, cobalt, tungsten, titanium aluminum nitride, titanium nitride, tantalum aluminum nitride, tungsten disilicide, cobalt silicide, nickel silicide, nickel, platinum silicide, etc. In some embodiments, at least about 80% of the sealant 108, e.g., at least about 85%, or at least about 90%, may be amorphous. A thickness of such a sealant may be in the range of about 5 to 50 nanometers, including all values and ranges therein.

In various embodiments, the sealant 108 may include two or more layers of different metallic conductive materials described above. In some embodiments, the sealant 108 may have a thickness between about 0.5 and 100 nanometers, including all values and ranges therein, e.g., between about 2 and 50 nanometers, or between about 5 and 25 nanometers.

In the embodiments where the low resistance contact material 112 is used as a contact material between at least one of the S/D electrodes 104, 106 and the channel material 102, the contact material 112 may include any material, or a combination of different such materials, that forms a small Schottky barrier between the metal of the S/D electrodes 104, 106 and the semiconductor of the channel material 102 underneath. A Schottky barrier is defined as the energy needed for the charge carriers (electrons or holes) to go from the contact metal to the semiconductor band edge (conduction band in case of N-type and valence band for P-type transistors). For example, when the channel material 102 include one or more oxide semiconductors, the contact material 112 may include one or more oxygen-gettering materials (i.e., reactive materials which getter oxygen) which are more reactive that the transition metal in the semiconductor of the channel material 102. For the example of the channel material 102 being zinc oxide, the contact material 112 could include one or more of titanium, hafnium, tantalum, tantalum nitride, titanium nitride, etc., as those materials tend to form more stable oxides than zinc oxide and will make the metal-semiconductor interface more conductive. In some embodiments, the contact material 112 may have a thickness between about 0.5 and 20 nanometers, including all values and ranges therein.

The exemplary embodiments shown in FIGS. 1A-1G all show the channel material 102 as described above and the S/D electrodes 104, 106 as described above provided over the channel material 102. These embodiments differ in how the sealant 108 and, in some of these embodiments, the contact material 112 are arranged with respect to the channel material 102 or/and the S/D electrodes 104, 106. While each of FIGS. 1A-1G illustrates both of the S/D electrodes 104, 106 as having the same arrangement of the sealant 108 and, optionally, the contact material 112, embodiments where only one of the S/D electrodes 104, 106 is sealed as shown in any of FIGS. 1A-1G, as well as embodiments where different ones of the S/D electrodes 104, 106 are sealed according to different examples shown in FIGS. 1A-1G, are also possible and are within the scope of the present disclosure.

FIG. 1A illustrates an exemplary S/D electrode-channel arrangement 100A where one or both of the S/D electrodes 104, 106 may be partially enclosed by the sealant 108 by virtue of having the sealant 108 provided over the top portion of the electrodes. In such an example, the S/D electrodes 104, 106 may be in contact with the channel material 102, and the sealant 108 may or may not be present on the sidewalls of the S/D electrodes 104, 106.

Figure 1B:
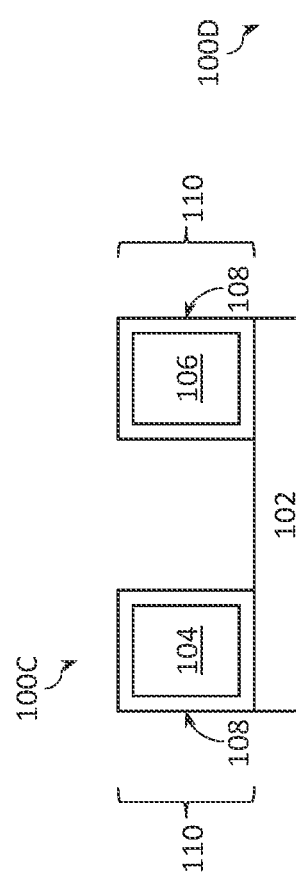

FIG. 1B illustrates an exemplary S/D electrode-channel arrangement 100B where one or both of the S/D electrodes 104, 106 may be partially enclosed by the sealant 108 by virtue of having the sealant 108 provided over the top and wrapping around the exposed portions of the electrodes. In such an example, similar to the arrangement 100A, the S/D electrodes 104, 106 may be in contact with the channel material 102. In some embodiments of the arrangement 100B, the sealant 108 may conform to the shape of the S/D electrodes 104, 106.

Figure 1C:
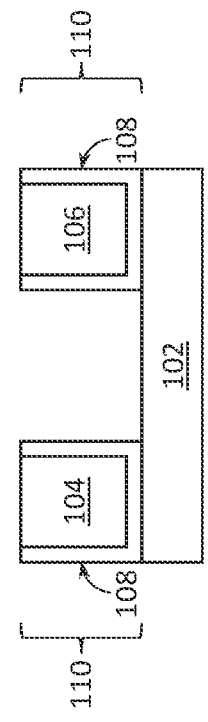

FIG. 1C illustrates an exemplary S/D electrode-channel arrangement 100C where one or both of the S/D electrodes 104, 106 may be partially enclosed by the sealant 108 by virtue of having the sealant 108 completely wrapping around the electrodes on both top and the bottom. In such an example, the S/D electrodes 104, 106 may not be in contact with the channel material 102 because the sealant 108 is provided between the channel material 102 and the S/D electrodes 104, 106. Thus, FIG. 1C illustrates an embodiment where at least a portion of the sealant 108 may interface the channel material 102 by being in contact with the channel material 102, or being in contact with an interfacial layer which may be spontaneously formed as a result of providing the material(s) of the sealant 108 on the channel material 102. In some embodiments of the arrangement 100C, the sealant 108 may conform to the shape of the S/D electrodes 104, 106.

Figure 1D:
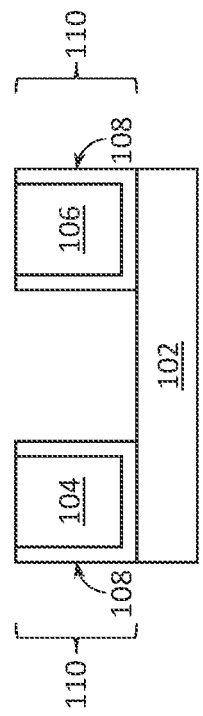

FIG. 1D illustrates an exemplary S/D electrode-channel arrangement 100D where one or both of the S/D electrodes 104, 106 may be partially enclosed by the sealant 108 by virtue of having the sealant 108 wrapping around the electrodes from the bottom. In such an example, similar to the arrangement 100C, the S/D electrodes 104, 106 may not be in contact with the channel material 102 because the sealant 108 is provided between the channel material 102 and the S/D electrodes 104, 106, but, in contrast to the arrangement 100C, the sealant 108 may be absent at least on some surfaces of the S/D electrodes.

FIGS. 1E-1G illustrate embodiments where the contact material 112 as described above is also used.

FIG. 1E illustrates an exemplary S/D electrode-channel arrangement 100E similar to the arrangement 100D in that one or both of the S/D electrodes 104, 106 may be partially enclosed by the sealant 108 by virtue of having the sealant 108 wrapping around the electrodes from the bottom. In contrast to the arrangement 100D, the arrangement 100E further includes the contact material 112 wrapping around the sealant 108, and therefore wrapping around the S/D electrodes 104, 106, from the bottom. In such an example, the sealant 108 may be provided between the S/D electrodes 104, 106 and the contact material 112, and the contact material 112 at the bottom of the S/D electrodes 104, 106 may be in contact with the channel material 102, as shown in FIG. 1E.

FIG. 1F illustrates an exemplary S/D electrode-channel arrangement 100F similar to the arrangement 100A in that one or both of the S/D electrodes 104, 106 may be partially enclosed by the sealant 108 by virtue of having the sealant 108 provided over the upper portions of the electrodes. In contrast to the arrangement 100A, but similar to the arrangement 100E, the arrangement 100F further includes the contact material 112 wrapping around the S/D electrodes 104, 106 from the bottom. In such an example, the sealant 108 may be provided on the upper sides of the S/D electrodes 104, 106, and the contact material 112 may be provided on the bottom sides and sidewalls of the S/D electrodes 104, 106. Thus, the contact material 112 may be provided between the S/D electrodes 104, 106 and the channel material 102. The arrangement 100F may be implemented when a fill-type or damascene contact flow processes are used to form the sealed S/D electrodes 110 as shown in FIG. 1F.

FIG. 1G illustrates an exemplary S/D electrode-channel arrangement 100G similar to the arrangement 100B in that one or both of the S/D electrodes 104, 106 may be partially enclosed by the sealant 108 by virtue of having the sealant 108 wrapping around the electrodes from the top. In contrast to the arrangement 100B, the arrangement 100G further includes the contact material 112 wrapping around the sealant 108, and therefore wrapping around the S/D electrodes 104, 106, from the top. In such an example, the sealant 108 may be provided between the S/D electrodes 104, 106 and the contact material 112, but the bottom of the S/D electrodes 104, 106 may be in contact with the channel material 102, as shown in FIG. 1G. The arrangement 100G may be implemented when the S/D electrodes 104, 106 are formed by subtractive etching. In some embodiments of the arrangement 100G, the sealant 108 may conform to the shape of the S/D electrodes 104, 106.

The transistor S/D electrode-channel arrangements 100 as described above may be included in any suitable transistor structure. For example, FIGS. 2A-2E provide cross-sectional side views of example single-gate transistors having S/D electrodes sealed with metallic sealants, according to various embodiments of the present disclosure, while FIGS. 3A-3C provide cross-sectional side views of example double-gate transistors having S/D electrodes sealed with metallic sealants, according to various embodiments of the present disclosure. Applicable to all embodiments of the transistor structures shown in FIGS. 2 and 3, the transistor structures include sealed S/D electrodes 110, each of which sealed S/D electrodes 110 may be sealed with the sealant 108 and, optionally, also provided with the contact material 112 as shown in any of FIGS. 1A-1G. Thus, any of the sealed S/D electrodes 110 of the transistors 200 and 300 discussed below with reference to FIGS. 2 and 3 may take the form of any of the embodiments of those components discussed above with reference to FIG. 1, which descriptions, therefore, are not repeated here in the interests of brevity. Also applicable to all embodiments of the transistor structures shown in FIGS. 2 and 3, the transistor structures further include a substrate 114, a gate dielectric 116, and a gate electrode 118. For the double-gate transistors of FIG. 3, different instances of the gate dielectric 116 are shown as a gate dielectric 116-1 for the first gate and a gate dielectric 116-2 for the second gate. Similarly, different instances of the gate electrode 118 in the double-gate transistors are shown in FIG. 3 as a gate electrode 118-1 for the first gate and a gate electrode 118-2 for the second gate.

The transistors 200 and 300 illustrated in FIGS. 2 and 3 do not represent an exhaustive set of transistor structures in which sealed S/D electrodes 110 may be included, but that may provide examples of such structures. For example, in other embodiments, any of the sealed S/D electrodes 110 described herein may be used in transistors implementing tri-gate or all-around gate architectures. FIGS. 2 and 3 are intended to show relative arrangements of the components therein, and, in various further embodiments, transistors 200 and 300 may include other components that are not illustrated (e.g., conductive pathways to the source, drain, and gate electrodes, etc.).

Furthermore, the transistors 200 and 300 illustrated in FIGS. 2 and 3 may further include other components not specifically shown, e.g. in order to not clutter the drawings or because there are many different ways to implement such other components. For example, each of the transistors illustrated in FIGS. 2 and 3 would also include S/D contacts electrically connected to the respective S/D electrodes, i.e., a source contact electrically connected to a source electrode and a drain contact electrically connected to a drain electrode, as known in the art. Such S/D contacts would be different from the sealant described herein in that they would include, or be comprised of, different materials than those included, or comprised, in the sealant. In various embodiments, depending on how exactly the sealant is implemented and depending on whether or not a resistance contact material is used, the S/D contacts may be 1) in contact with the S/D electrodes, while the sealant is enclosing other portions of the S/D electrodes, 2) in contact with the sealant, i.e., at least a portion of the sealant may be between a S/D contact and a corresponding S/D electrode, e.g. for each S/D electrode, or 3) in contact with the resistance contact material, while at least a portion of the sealant is enclosing other portions of the S/D electrodes or/and at least a portion of the sealant is between a S/D contact and a corresponding S/D electrode, e.g. for each S/D electrode.

The substrate 114 may be any structure on which a transistor, e.g., a TFT, with the sealed S/D electrodes 110, and other elements of the transistors described herein, may be disposed. In some embodiments, the substrate 114 may include a semiconductor, such as silicon. In some embodiments, the substrate 114 may include an insulating layer, such as an oxide isolation layer. For example, in the embodiments, the substrate 114 may include a semiconductor material and an interface layer dielectric (ILD) disposed between the semiconductor material of the channel material 102 and the S/D electrodes 104, 106, to electrically isolate the semiconductor material of the substrate 114 from the S/D electrodes 104, 106 and the channel material 102, and thereby mitigate the likelihood that a conductive pathway will form between the source and the drain of the transistor through the substrate 114). Examples of ILDs that may be included in a substrate 114 in some embodiments may include silicon oxide, silicon nitride, aluminum oxide, and/or silicon oxynitride. In other embodiments, the substrate 114 may be an insulating substrate, e.g., may be a transparent substrate such as glass, and may include any suitable coatings provided thereon, e.g., in some embodiments the substrate 114 may include an ITO coating provided over a glass substrate.

The gate dielectric 116 may include one or more high-k dielectric materials and may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 116 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 116 during manufacture of the transistors 200, 300 to improve the quality of the gate dielectric 116. In some embodiments, the gate dielectric 116 may have a thickness between about 0.5 nanometers and 3 nanometers, including all values and ranges therein, e.g., between about 1 and 3 nanometers, or between about 1 and 2 nanometers.

In some embodiments, the gate dielectric 116 may be a multilayer gate dielectric, e.g., it may include any of the high-k dielectric materials in one layer and a layer of IGZO. In some embodiments, the gate stack (i.e., a combination of the gate dielectric 116 and the gate electrode 118) may be arranged so that the IGZO is disposed between the high-k dielectric and the channel material 102. In such embodiments, the IGZO may be in contact with the channel material 102, and may provide the interface between the channel material 102 and the remainder of the multilayer gate dielectric 116. The IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10).

The gate electrode material 118 may include at least one P-type work function metal or N-type work function metal, depending on whether the sealed S/D electrodes 110 are to be included in a P-type metal oxide semiconductor (PMOS) transistor or an N-type metal oxide semiconductor (NMOS) transistor. For a PMOS transistor, metals that may be used for the gate electrode material 118 may include, but are not limited to, ruthenium, palladium, platinum, cobalt, nickel, and conductive metal oxides (e.g., ruthenium oxide). For an NMOS transistor, metals that may be used for the gate electrode material 118 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode material 118 may consist of a stack of two or more metal layers, where one or more metal layers are work function metal layers and at least one metal layer is a fill metal layer. Further metal layers may be included for other purposes, such as to act as a barrier layer.

Figure 2A:
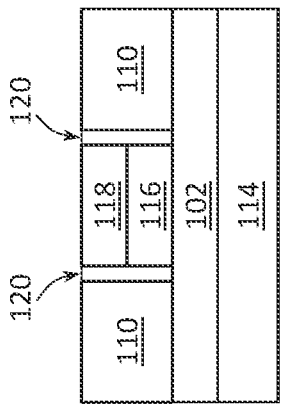
FIGS. 2A-2E provide cross-sectional side views of example single-gate transistors having S/D electrodes sealed with metallic conductive sealants, according to various embodiments of the present disclosure.

FIG. 2A depicts a transistor 200A including sealed S/D electrodes 110 and having a single "top" gate provided by a gate stack of the gate electrode material 118 and the gate dielectric 116, illustrating a first embodiment of a top-gate transistor in which metallic conductive sealants as described herein may be used. As shown in FIG. 2A, the gate dielectric 116 may be disposed between the gate electrode material 118 and the channel material 102, and the channel material 102 may be provided over the substrate 114, e.g., the channel material 102 may be in contact with the substrate 114. Furthermore, the sealed S/D electrodes 110 may also be disposed on the substrate 114, and may be in contact with the substrate 114. In the embodiment of FIG. 2A, at least some portions of the sealed S/D electrodes 110 may be coplanar with at least some portions of the channel material 102.

Figure 2B:
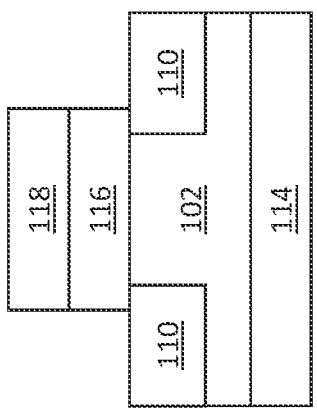

FIG. 2B depicts a transistor 200B including sealed S/D electrodes 110 and having a single "top" gate provided by a gate stack of the gate electrode material 118 and the gate dielectric 116, illustrating a second embodiment of a top-gate transistor in which metallic conductive sealants as described herein may be used. Similar to FIG. 2A, in FIG. 2B the gate dielectric 116 may be disposed between the gate electrode material 118 and the channel material 102, and the channel material 102 may be provided over the substrate 114, e.g., the channel material 102 may be in contact with the substrate 114. Different from FIG. 2A, in FIG. 2B the sealed S/D electrodes 110 are not in contact with the substrate 114, but, instead, are disposed over the channel material 102, and may be in contact with the channel material 102. As also shown in FIG. 2B, the transistor 200B provides an example where the gate stack is provided in a plane different from that of the sealed S/D electrodes 110.

Figure 2C:
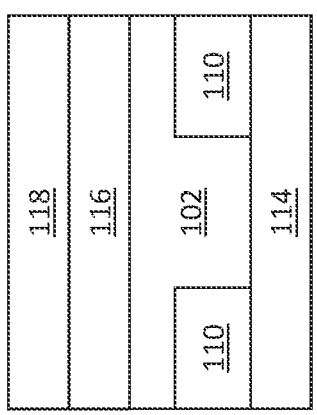

FIG. 2C depicts a transistor 200C including sealed S/D electrodes 110 and having a single "top" gate provided by a gate stack of the gate electrode material 118 and the gate dielectric 116, illustrating a third embodiment of a top-gate transistor in which metallic conductive sealants as described herein may be used. Similar to FIG. 2A, in FIG. 2C the gate dielectric 116 may be disposed between the gate electrode material 118 and the channel material 102, the channel material 102 may be provided over the substrate 114, e.g., the channel material 102 may be in contact with the substrate 114, and the sealed S/D electrodes 110 may be in contact with the substrate 114. Different from FIG. 2A, in FIG. 2C portions of the sealed S/D electrodes 110 and the gate stack may be provided in the same plane, over different portions of the channel material 102. In such an embodiment, the gate stack may be electrically isolated from the sealed S/D electrodes 110 using a spacer material 120. The spacers 120 may be formed of any suitable insulating dielectric material, such as a hafnium oxide, carbon-doped oxide, silicon nitride, silicon oxide, or other carbides or nitrides (e.g., silicon carbide, silicon nitride doped with carbon, and silicon oxynitride). In the embodiment of FIG. 2C, at least some portions of the sealed S/D electrodes 110 may be coplanar with at least some portions of the gate dielectric 116.

Figure 2D:
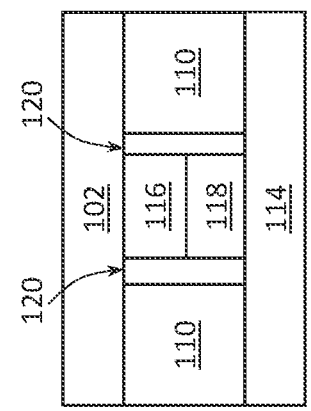

FIG. 2D depicts a transistor 200D including sealed S/D electrodes 110 and having a single "bottom" gate provided by a gate stack of the gate electrode material 118 and the gate dielectric 116, illustrating a first embodiment of a bottom-gate transistor in which metallic conductive sealants as described herein may be used. As shown in FIG. 2D, the gate dielectric 116 may be disposed between the gate electrode material 118 and the channel material 102, and gate electrode material 118 may be disposed between the gate dielectric 116 and the substrate 114, e.g., the gate electrode material 118 may be in contact with the substrate 114. As also shown in FIG. 2D, the sealed S/D electrodes 110 may be provided on the other side of the channel material 102 compared to the gate stack, i.e., on a face of the channel material 102 that is opposite the face in contact with the gate stack.

Figure 2E:
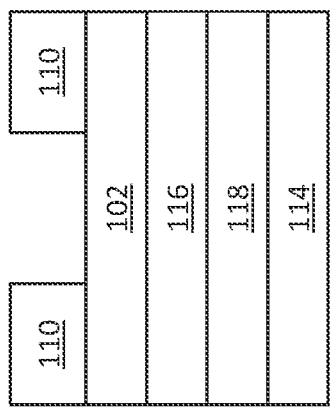

FIG. 2E depicts a transistor 200E including sealed S/D electrodes 110 and having a single "bottom" gate provided by a gate stack of the gate electrode material 118 and the gate dielectric 116, illustrating a second embodiment of a bottom-gate transistor in which metallic conductive sealants as described herein may be used. Similar to FIG. 2C, in FIG. 2E, the sealed S/D electrodes 110 and the gate stack may be provided in the same plane, in contact with the different portions of the channel material 102. Different from FIG. 2C, in FIG. 2E the sealed S/D electrodes 110 and the gate stack are provided between the substrate 114 and the channel material 102. In such an embodiment, the gate stack may be electrically isolated from the sealed S/D electrodes 110 using a spacer material 120, as described for FIG. 2C. In the embodiment of FIG. 2E, at least some portions of the sealed S/D electrodes 110 may be coplanar with at least some portions of the gate electrode 118.

FIG. 3A depicts a transistor 300A including two transistor gate stacks, the first one formed by the gate electrode material 118-1 and the gate dielectric 116-1 and the second one formed by the gate electrode material 118-2 and the gate dielectric 116-2, illustrating a first embodiment of a double-gate transistor in which metallic conductive sealants as described herein may be used. The portion of the transistor 300A with the first gate is similar to the transistor shown in FIG. 2D in that the gate dielectric 116-1 may be disposed between the gate electrode material 118-1 and the channel material 102, the gate electrode material 118-1 may be disposed between the gate dielectric 116-1 and the substrate 114, e.g., the gate electrode material 118-1 may be in contact with the substrate 114, and the sealed S/D electrodes 110 may be provided on the other side of the channel material 102 compared to the first gate stack, i.e., on a face of the channel material 102 that is opposite the face in contact with the first gate stack. In addition, the transistor 300A further includes a second gate stack where the gate dielectric 116-2 is disposed over the sealed S/D electrodes 110 and the channel material 102, and the gate electrode material 118-2 is disposed over the gate dielectric 116-2. In the embodiment of FIG. 3A, at least some portions of the sealed S/D electrodes 110 may be coplanar with at least some portions of the gate dielectric 116-2.

FIG. 3B depicts a transistor 300B including two transistor gate stacks, the first one formed by the gate electrode material 118-1 and the gate dielectric 116-1 and the second one formed by the gate electrode material 118-2 and the gate dielectric 116-2, illustrating a second embodiment of a double-gate transistor in which metallic conductive sealants as described herein may be used. In the embodiment of FIG. 3B, at least some portions of the sealed S/D electrodes 110 may be coplanar with at least some portions of the channel material 102. The sealed S/D electrodes 110 and the channel material 102 may be sandwiched between the first and second gate stacks, as shown in FIG. 3B where, for each gate stack, the gate dielectric 116 is provided between the gate electrode 118 and the channel material 102. The gate dielectric 116-1 may be disposed between the gate electrode material 118-1 and the channel material 102, the gate electrode material 118-1 may be disposed between the gate dielectric 116-1 and the substrate 114, e.g., the gate electrode material 118-1 may be in contact with the substrate 114.

FIG. 3C depicts a transistor 300C including two transistor gate stacks, the first one formed by the gate electrode material 118-1 and the gate dielectric 116-1 and the second one formed by the gate electrode material 118-2 and the gate dielectric 116-2, illustrating a third embodiment of a double-gate transistor in which metallic conductive sealants as described herein may be used. In FIG. 3C, the channel material 102 may be sandwiched between the first and second gate stacks, where, for each gate stack, the gate dielectric 116 is provided between the gate electrode 118 and the channel material 102. Portions of the sealed S/D electrodes 110 and the second gate stack may be provided in the same plane, over different portions of the channel material 102. In such an embodiment, the second gate stack may be electrically isolated from the sealed S/D electrodes 110 using a spacer material 120 as described above. Such a spacer material may also be provided on the sides of the first gate stack formed over the substrate 114. In the embodiment of FIG. 3C, at least some portions of the sealed S/D electrodes 110 may be coplanar with at least some portions of the gate dielectric 116-2.

Although particular arrangements of materials are discussed above with reference to FIGS. 1-3, intermediate materials may be included in the arrangements 100, and in the transistors 200 and 300, e.g., various interfacial layers which may spontaneously form when two different materials are brought together. Additionally, although various components of the arrangements 100 and of the transistors 200 and 300 are illustrated in FIGS. 1-3 as being planar rectangles or formed of rectangular solids, this is simply for ease of illustration, and embodiments of these arrangements and transistors may be curved, rounded, or otherwise irregularly shaped as dictated by the manufacturing processes used to fabricate the arrangements and transistors with S/D electrodes at least partially encompassed with a metallic conductive sealant as described herein.

Figure 4:
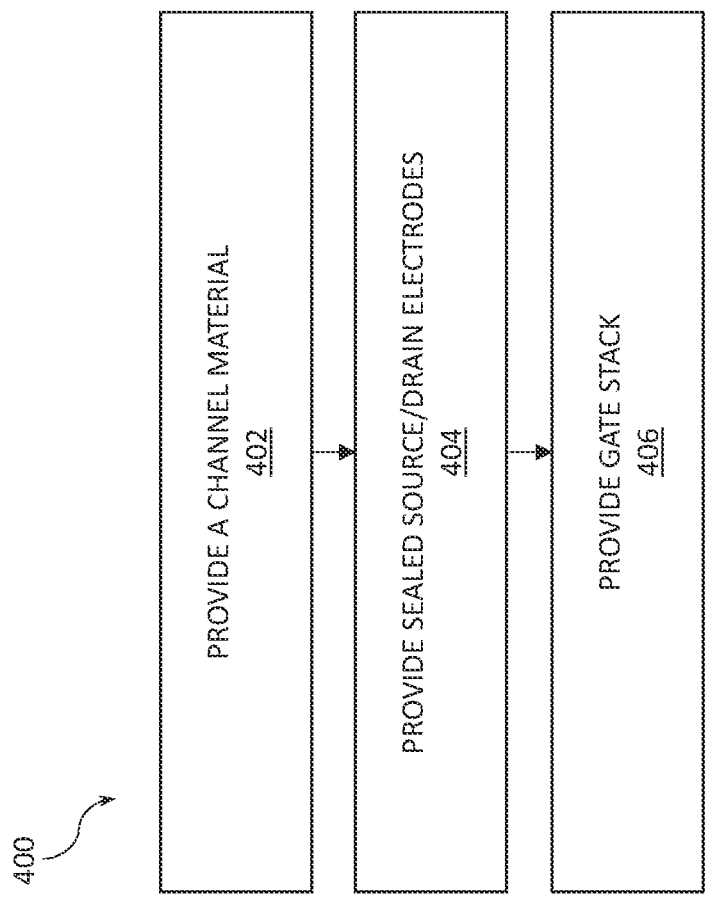
FIG. 4 is a flow diagram of an example method of manufacturing a transistors having S/D electrodes sealed with metallic conductive sealants, according to some embodiments of the present disclosure.

Transistors with sealed S/D electrodes 110 disclosed herein may be manufactured using any suitable techniques. For example, FIG. 4 is a flow diagram of an example method 400 of manufacturing a transistor having S/D electrodes sealed with metallic conductive sealants, in accordance with various embodiments. Although the operations of the method 400 are illustrated once each and in a particular order, the operations may be performed in any suitable order and repeated as desired. For example, one or more operations may be performed in parallel to manufacture multiple transistors substantially simultaneously. In another example, the operations may be performed in a different order to reflect the structure of a transistor in which the sealed S/D electrodes as described herein will be included (e.g., the gate stack may be provided before the sealed S/D electrodes or/and before the channel material 102). In addition, the manufacturing method 400 may include other operations, not specifically shown in FIG. 4, e.g., various cleaning operations as known in the art. For example, in some embodiments, the structure/assembly may be cleaned prior to or/and after any of the processes of the method 400 described herein, e.g., to remove surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the method 400 may further include other manufacturing operations related to fabrication of other components of a transistor, also not specifically shown in FIG. 4.

At 402, a channel material may be provided. The channel material provided at 402 may take the form of any of the embodiments of the channel material 102 disclosed herein, for example (e.g., any of the embodiments discussed herein with reference to the arrangements 100 or/and with reference to the transistors 200 and 300). The channel material may be provided at 402 using any suitable deposition, and possibly patterning, techniques known in the art.

At 404, sealed S/D electrodes may be provided. The sealed S/D electrodes provided at 404 may take the form of any of the embodiments of the sealed S/D electrodes 110 disclosed herein, for example (e.g., any of the embodiments discussed herein with reference to the arrangements 100 or/and with reference to the transistors 200 and 300). The sealed S/D electrodes may be provided at 404 using any deposition and patterning techniques known in the art suitable for at least partially enclosing the S/D electrodes, e.g., the S/D electrodes 104, 106 described herein, with a metallic conductive sealant, e.g., the sealant 108 described herein. For example, in some embodiments, the sealant 108, or some layers of the sealant 108, may be provided by physical vapor deposition (PVD), such as sputtering. In some embodiments, the sealant 108, or some layers of the sealant 108, may be provided by atomic layer deposition (ALD). In some embodiments, the sealant 108, or some layers of the sealant 108, may be provided by chemical vapor deposition (CVD).

At 406, a gate stack may be provided. The gate stack provided at 406 may take the form of any of the embodiments of the gate stacks comprising a gate dielectric 116 and a gate electrode material 118 disclosed herein, for example (e.g., any of the embodiments discussed herein with reference to the transistors 200 and 300). The gate stack may be provided at 406 using any suitable deposition and patterning technique known in the art.

Transistor S/D electrodes sealed with a metallic conductive sealant as disclosed herein may be included in any suitable electronic device. FIGS. 5-8 illustrate various examples of apparatuses that may include one or more of the sealed S/D electrodes disclosed herein.

Figure 5B:
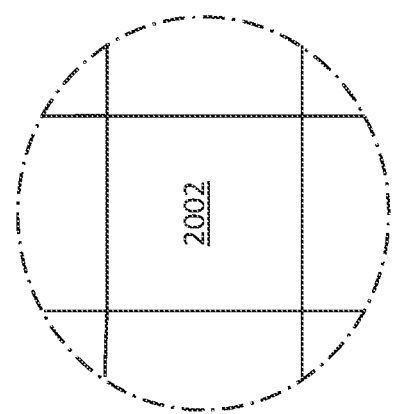
FIGS. 5A and 5B are top views of a wafer and dies that include one or more transistors having S/D electrodes sealed with metallic conductive sealants, according to some embodiments of the present disclosure.
Figure 5A:
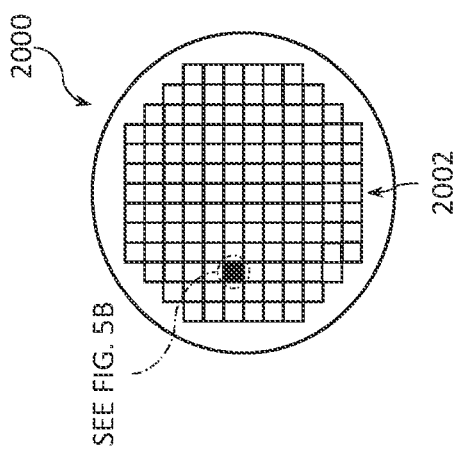

FIGS. 5A-5B are top views of a wafer 2000 and dies 2002 that may include one or more S/D electrodes sealed with a metallic conductive sealant in accordance with any of the embodiments disclosed herein. The wafer 2000 may be composed of semiconductor material and may include one or more dies 2002 having IC structures formed on a surface of the wafer 2000. Each of the dies 2002 may be a repeating unit of a semiconductor product that includes any suitable IC, e.g., ICs which may include one or more transistor S/D electrode-channel arrangements 100, or/and one or more transistors 200 or/and 300, or any other device components implementing S/D electrodes sealed with a metallic conductive sealant as described herein. After the fabrication of the semiconductor product is complete (e.g., after manufacture of one or more transistor S/D electrode-channel arrangements 100, or/and one or more transistors 200 or/and 300 as described herein), the wafer 2000 may undergo a singulation process in which each of the dies 2002 is separated from one another to provide discrete "chips" of the semiconductor product. In particular, devices that include one or more sealed S/D electrodes as disclosed herein may take the form of the wafer 2000 (e.g., not singulated) or the form of the die 2002 (e.g., singulated). The die 2002 may include one or more transistors (e.g., one or more of the transistors 2140 of FIG. 6, discussed below, which may take the form of any of the transistors with sealed S/D electrodes as described herein) and/or supporting circuitry to route electrical signals to the transistors, as well as any other IC components. In some embodiments, the wafer 2000 or the die 2002 may include a memory device (e.g., a static random access memory (SRAM) device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2302 of FIG. 8) or other logic that is configured to store information in the memory devices or execute instructions stored in the memory array.

Figure 6:
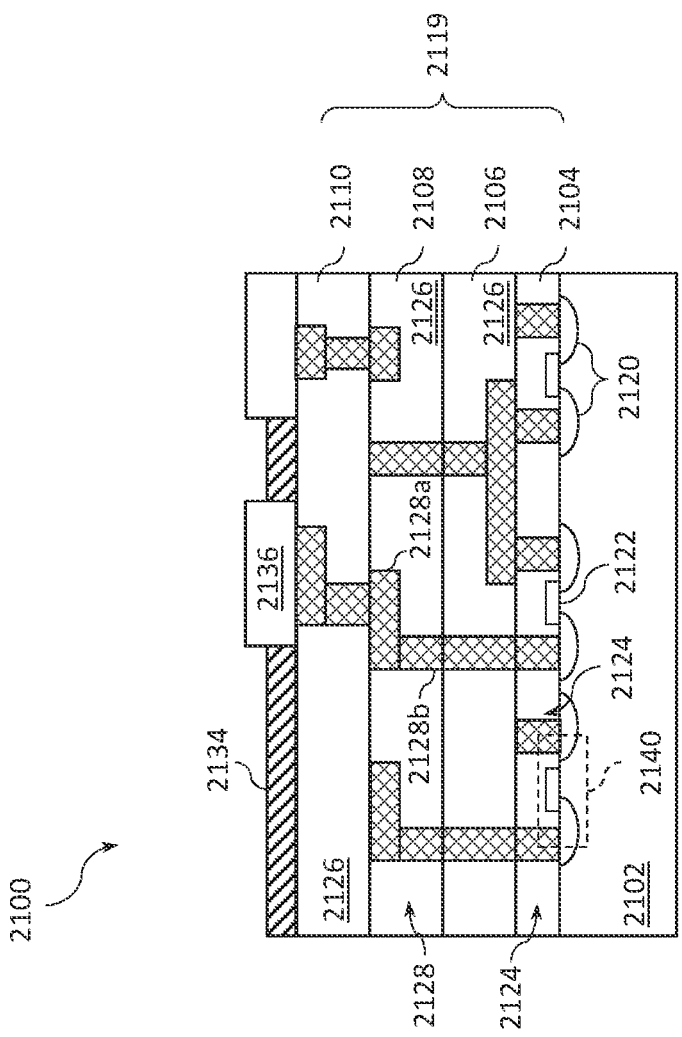
FIG. 6 is a cross-sectional side view of an integrated circuit (IC) device that may include one or more transistors having S/D electrodes sealed with metallic conductive sealants, according to some embodiments of the present disclosure.

FIG. 6 is a cross-sectional side view of an IC device 2100 that may include one or more transistor S/D electrode-channel arrangements implementing S/D electrodes sealed with a metallic conductive sealant in accordance with any of the embodiments disclosed herein. The IC device 2100 may be formed on a substrate 2102 (e.g., the wafer 2000 of FIG. 5A) and may be included in a die (e.g., the die 2002 of FIG. 5B). The substrate 2102 may be a semiconductor substrate composed of semiconductor material systems including, for example, N-type or P-type materials systems. The substrate 2102 may include, for example, a crystalline substrate formed using a bulk silicon or a silicon-on-insulator substructure. In some embodiments, the semiconductor substrate 2102 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the substrate 2102. Although a few examples of materials from which the substrate 2102 may be formed are described here, any material that may serve as a foundation for an IC device 2100 may be used. The substrate 2102 may be part of a singulated die (e.g., the dies 2002 of FIG. 5B) or a wafer (e.g., the wafer 2000 of FIG. 5A).

The IC device 2100 may include one or more device layers 2104 disposed on the substrate 2102. The device layer 2104 may include features of one or more transistors 2140 (e.g., metal oxide semiconductor field-effect transistors (MOSFETs)) formed on the substrate 2102. The device layer 2104 may include, for example, one or more source and/or drain (S/D) regions 2120, a gate 2122 to control current flow in the transistors 2140 between the S/D regions 2120, and one or more S/D contacts 2124 to route electrical signals to/from the S/D regions 2120. Although not specifically shown in FIG. 6, the transistors 2140 may be transistors having transistor S/D electrode-channel arrangements with sealed S/D electrodes as described herein, e.g., be any of the transistors illustrated in FIGS. 2-3, or any further embodiments of such transistors described herein. The S/D regions 2120 may be formed within the substrate 2102 either adjacent to or at a distance from the gate 2122 of each transistor 2140, using any suitable processes known in the art, some of which are described above. The transistors 2140 may include additional features not depicted for the sake of clarity, such as additional device isolation regions, gate contacts, and the like. The transistors 2140 are not limited to the type and configuration depicted in FIG. 6 or in FIGS. 2-3 and may include a wide variety of other types and configurations such as, for example, planar transistors, non-planar transistors, or a combination of both. Non-planar transistors may include FinFET transistors, e.g., double-gate transistors or tri-gate transistors, and wrap-around or all-around gate transistors, such as nanoribbon and nanowire transistors.

Each transistor 2140 may include a gate 2122 formed of at least two layers, a gate dielectric layer and a gate electrode layer. The descriptions provided above with respect to the gate dielectric 116 and the gate electrode 118 are generally applicable to the gate dielectric layer and the gate electrode layer, respectively, of a transistor 2140 and, therefore, in the interests of brevity, are not repeated here.

Electrical signals, such as power and/or input/output (I/O) signals, may be routed to and/or from the transistors 2140 of the device layer 2104 through one or more interconnect layers disposed on the device layer 2104 (illustrated in FIG. 6 as interconnect layers 2106-2110). For example, electrically conductive features of the device layer 2104 (e.g., the gate 2122 and the S/D contacts 2124) may be electrically coupled with the interconnect structures 2128 of the interconnect layers 2106-2110. The one or more interconnect layers 2106-2110 may form an interlayer dielectric (ILD) stack 2119 of the IC device 2100.

The interconnect structures 2128 may be arranged within the interconnect layers 2106-2110 to route electrical signals according to a wide variety of designs (in particular, the arrangement is not limited to the particular configuration of interconnect structures 2128 depicted in FIG. 6). Although a particular number of interconnect layers 2106-2210 is depicted in FIG. 6, embodiments of the present disclosure include IC devices having more or fewer interconnect layers than depicted.

In some embodiments, the interconnect structures 2128 may include trench structures 2128a (sometimes referred to as "lines") and/or via structures 2128b (sometimes referred to as "holes") filled or lined with an electrically conductive material such as a metal. The trench structures 2128a may be arranged to route electrical signals in a direction of a plane that is substantially parallel with a surface of the substrate 2102 upon which the device layer 2104 is formed. For example, the trench structures 2128a may route electrical signals in a direction in and out of the page from the perspective of FIG. 6. The via structures 2128b may be arranged to route electrical signals in a direction of a plane that is substantially perpendicular to the surface of the substrate 2102 upon which the device layer 2104 is formed. In some embodiments, the via structures 2128b may electrically couple trench structures 2128a of different interconnect layers 2106-2110 together.

The interconnect layers 2106-2110 may include a dielectric material 2126 disposed between the interconnect structures 2128, as shown in FIG. 6. In some embodiments, the dielectric material 2126 disposed between the interconnect structures 2128 in different ones of the interconnect layers 2106-2110 may have different compositions; in other embodiments, the composition of the dielectric material 2126 between different interconnect layers 2106-2110 may be the same.

A first interconnect layer 2106 (referred to as Metal 1 or "M1") may be formed directly on the device layer 2104. In some embodiments, the first interconnect layer 2106 may include trench structures 2128a and/or via structures 2128b, as shown. The trench structures 2128a of the first interconnect layer 2106 may be coupled with contacts (e.g., the S/D contacts 2124) of the device layer 2104.

A second interconnect layer 2108 (referred to as Metal 2 or "M2") may be formed directly on the first interconnect layer 2106. In some embodiments, the second interconnect layer 2108 may include via structures 2128*b* to couple the trench structures 2128*a* of the second interconnect layer 2108 with the trench structures 2128*a* of the first interconnect layer 2106. Although the trench structures 2128*a* and the via structures 2128*b* are structurally delineated with a line within each interconnect layer (e.g., within the second interconnect layer 2108) for the sake of clarity, the trench structures 2128*a* and the via structures 2128*b* may be structurally and/or materially contiguous (e.g., simultaneously filled during a dual-damascene process) in some embodiments.

A third interconnect layer 2110 (referred to as Metal 3 or "M3") (and additional interconnect layers, as desired) may be formed in succession on the second interconnect layer 2108 according to similar techniques and configurations described in connection with the second interconnect layer 2108 or the first interconnect layer 2106.

The IC device 2100 may include a solder resist material 2134 (e.g., polyimide or similar material) and one or more bond pads 2136 formed on the interconnect layers 2106-2110. The bond pads 2136 may be electrically coupled with the interconnect structures 2128 and configured to route the electrical signals of the transistor(s) 2140 to other external devices. For example, solder bonds may be formed on the one or more bond pads 2136 to mechanically and/or electrically couple a chip including the IC device 2100 with another component (e.g., a circuit board). The IC device 2100 may have other alternative configurations to route the electrical signals from the interconnect layers 2106-2110 than depicted in other embodiments. For example, the bond pads 2136 may be replaced by or may further include other analogous features (e.g., posts) that route the electrical signals to external components.

Figure 7:
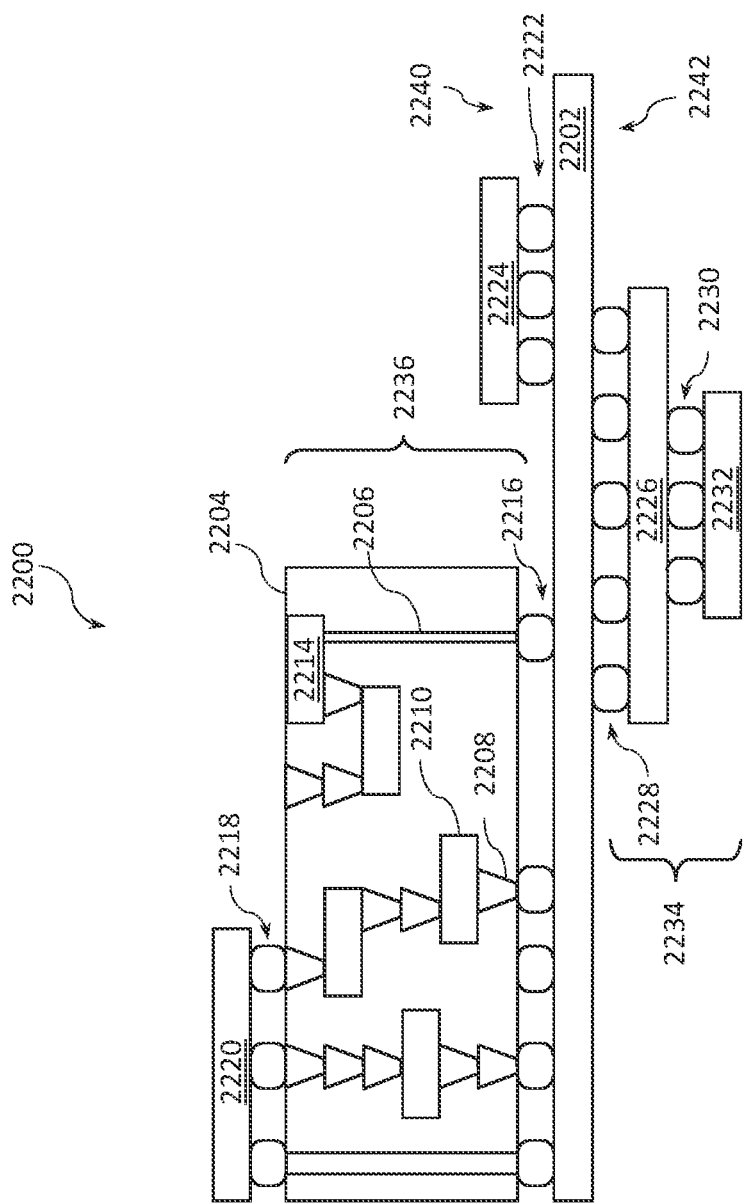
FIG. 7 is a cross-sectional side view of an IC device assembly that may include one or more transistors having S/D electrodes sealed with metallic conductive sealants, according to some embodiments of the present disclosure.

FIG. 7 is a cross-sectional side view of an IC device assembly 2200 that may include one or more transistor S/D electrode-channel arrangements with S/D electrodes sealed with a metallic conductive sealant in accordance with any of the embodiments disclosed herein. The IC device assembly 2200 includes a number of components disposed on a circuit board 2202 (which may be, e.g., a motherboard). The IC device assembly 2200 includes components disposed on a first face 2240 of the circuit board 2202 and an opposing second face 2242 of the circuit board 2202; generally, components may be disposed on one or both faces 2240 and 2242. In particular, any suitable ones of the components of the IC device assembly 2200 may include any of the sealed S/D electrodes in accordance with any of the embodiments disclosed herein, e.g., may include any of the transistors illustrated in FIGS. 2-3, or any further embodiments of such transistors described herein.

In some embodiments, the circuit board 2202 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2202. In other embodiments, the circuit board 2202 may be a non-PCB substrate.

The IC device assembly 2200 illustrated in FIG. 7 may include a package-on-interposer structure 2236 coupled to the first face 2240 of the circuit board 2202 by coupling components 2216. The coupling components 2216 may electrically and mechanically couple the package-on-interposer structure 2236 to the circuit board 2202, and may include solder balls (as shown in FIG. 7), male and female portions of a socket, an adhesive, an underfill material, and/or any other suitable electrical and/or mechanical coupling structure.

The package-on-interposer structure 2236 may include an IC package 2220 coupled to an interposer 2204 by coupling components 2218. The coupling components 2218 may take any suitable form for the application, such as the forms discussed above with reference to the coupling components 2216. Although a single IC package 2220 is shown in FIG. 7, multiple IC packages may be coupled to the interposer 2204; indeed, additional interposers may be coupled to the interposer 2204. The interposer 2204 may provide an intervening substrate used to bridge the circuit board 2202 and the IC package 2220. The IC package 2220 may be or include, for example, a die (the die 2002 of FIG. 5B), an IC device (e.g., the IC device 2100 of FIG. 6), or any other suitable component, and may include any embodiments of one or more transistor S/D electrode-channel arrangements with sealed S/D electrodes as described herein or any of the transistors illustrated in FIGS. 2-3, or any further embodiments of such transistors described herein. Generally, the interposer 2204 may spread a connection to a wider pitch or reroute a connection to a different connection. For example, the interposer 2204 may couple the IC package 2220 (e.g., a die) to a ball grid array (BGA) of the coupling components 2216 for coupling to the circuit board 2202. In the embodiment illustrated in FIG. 7, the IC package 2220 and the circuit board 2202 are attached to opposing sides of the interposer 2204; in other embodiments, the IC package 2220 and the circuit board 2202 may be attached to a same side of the interposer 2204. In some embodiments, three or more components may be interconnected by way of the interposer 2204.

The interposer 2204 may be formed of an epoxy resin, a fiberglass-reinforced epoxy resin, a ceramic material, or a polymer material such as polyimide. In some implementations, the interposer 2204 may be formed of alternate rigid or flexible materials that may include the same materials described above for use in a semiconductor substrate, such as silicon, germanium, and other group III-N and group IV materials. The interposer 2204 may include metal interconnects 2208 and vias 2210, including but not limited to through-silicon vias (TSVs) 2206. The interposer 2204 may further include embedded devices 2214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 2204. The package-on-interposer structure 2236 may take the form of any of the package-on-interposer structures known in the art.

The IC device assembly 2200 may include an IC package 2224 coupled to the first face 2240 of the circuit board 2202 by coupling components 2222. The coupling components 2222 may take the form of any of the embodiments discussed above with reference to the coupling components 2216, and the IC package 2224 may take the form of any of the embodiments discussed above with reference to the IC package 2220.

As also shown in FIG. 7, the IC device assembly 2200 may further include a package-on-package structure 2234 coupled to the second face 2242 of the circuit board 2202 by coupling components 2228. The package-on-package structure 2234 may include an IC package 2226 and an IC package 2232 coupled together by coupling components 2230 such that the IC package 2226 is disposed between the circuit board 2202 and the IC package 2232. The coupling components 2228 and 2230 may take the form of any of the embodiments of the coupling components 2216 discussed above, and the IC packages 2226 and 2232 may take the form of any of the embodiments of the IC package 2220 discussed above. The package-on-package structure 2234 may be configured in accordance with any of the package-on-package structures known in the art.

Figure 8:
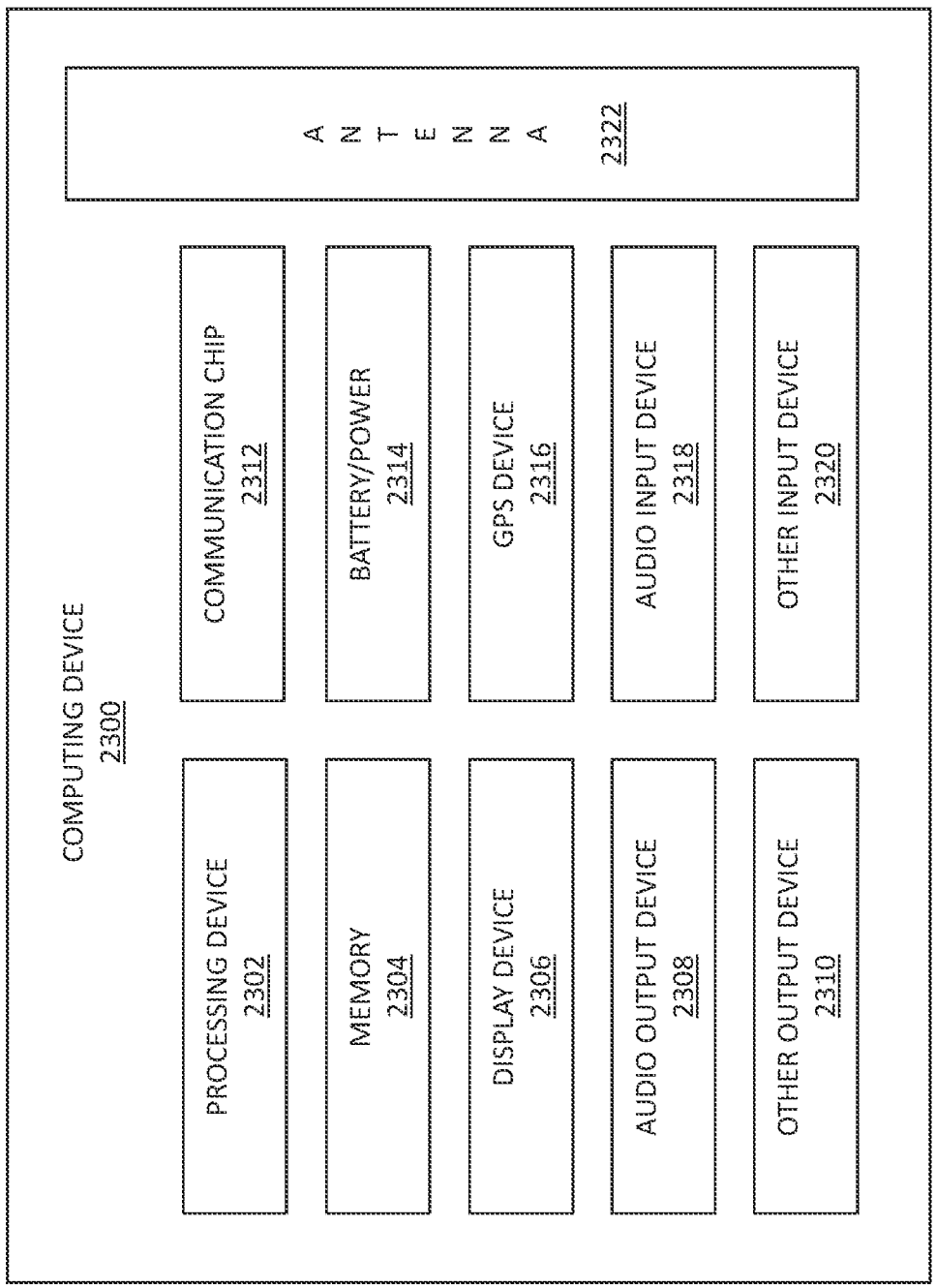
FIG. 8 is a block diagram of an example computing device that may include one or more transistors having S/D electrodes sealed with metallic conductive sealants, according to some embodiments of the present disclosure.

FIG. 8 is a block diagram of an example computing device 2300 that may include one or more device assemblies implementing transistor S/D electrode-channel arrangements with S/D electrodes sealed with a metallic conductive sealant in accordance with any of the embodiments disclosed herein. For example, any suitable ones of the components of the computing device 2300 may include a die (e.g., the die 2002 (FIG. 5B)) having sealed S/D electrodes as described herein, e.g., any embodiments of one or more transistor S/D electrode-channel arrangements 100, or/and one or more transistors 200 or/and 300, or any other device components implementing S/D electrodes sealed with a metallic conductive sealant as described herein. Any one or more of the components of the computing device 2300 may include, or be included in, an IC device 2100 (FIG. 6). Any one or more of the components of the computing device 2300 may include, or be included in, an IC device assembly 2200 (FIG. 7).

A number of components are illustrated in FIG. 8 as included in the computing device 2300, but any one or more of these components may be omitted or duplicated, as suitable for the application. In some embodiments, some or all of the components included in the computing device 2300 may be attached to one or more motherboards. In some embodiments, some or all of these components are fabricated onto a single system-on-chip (SoC) die.

Additionally, in various embodiments, the computing device 2300 may not include one or more of the components illustrated in FIG. 8, but the computing device 2300 may include interface circuitry for coupling to the one or more components. For example, the computing device 2300 may not include a display device 2306, but may include display device interface circuitry (e.g., a connector and driver circuitry) to which a display device 2306 may be coupled. In another set of examples, the computing device 2300 may not include an audio input device 2318 or an audio output device 2308, but may include audio input or output device interface circuitry (e.g., connectors and supporting circuitry) to which an audio input device 2318 or audio output device 2308 may be coupled.

The computing device 2300 may include a processing device 2302 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2302 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2300 may include a memory 2304, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, the memory 2304 may include memory that shares a die with the processing device 2302. This memory may be used as cache memory and may include embedded dynamic random access memory (eDRAM) or spin transfer torque magnetic random access memory (STT-MRAM).

In some embodiments, the computing device 2300 may include a communication chip 2312 (e.g., one or more communication chips). For example, the communication chip 2312 may be configured for managing wireless communications for the transfer of data to and from the computing device 2300. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2312 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2312 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2312 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2312 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2312 may operate in accordance with other wireless protocols in other embodiments. The computing device 2300 may include an antenna 2322 to facilitate wireless communications and/or to receive other wireless communications (such as AM or FM radio transmissions).

In some embodiments, the communication chip 2312 may manage wired communications, such as electrical, optical, or any other suitable communication protocols (e.g., the Ethernet). As noted above, the communication chip 2312 may include multiple communication chips. For instance, a first communication chip 2312 may be dedicated to shorter-range wireless communications such as Wi-Fi or Bluetooth, and a second communication chip 2312 may be dedicated to longer-range wireless communications such as global positioning system (GPS), EDGE, GPRS, CDMA, WiMAX, LTE, EV-DO, or others. In some embodiments, a first communication chip 2312 may be dedicated to wireless communications, and a second communication chip 2312 may be dedicated to wired communications.

The computing device 2300 may include battery/power circuitry 2314. The battery/power circuitry 2314 may include one or more energy storage devices (e.g., batteries or capacitors) and/or circuitry for coupling components of the computing device 2300 to an energy source separate from the computing device 2300 (e.g., AC line power).

The computing device 2300 may include a display device 2306 (or corresponding interface circuitry, as discussed above). The display device 2306 may include any visual indicators, such as a heads-up display, a computer monitor, a projector, a touchscreen display, a liquid crystal display (LCD), a light-emitting diode display, or a flat panel display, for example.

The computing device 2300 may include an audio output device 2308 (or corresponding interface circuitry, as discussed above). The audio output device 2308 may include any device that generates an audible indicator, such as speakers, headsets, or earbuds, for example.

The computing device 2300 may include an audio input device 2318 (or corresponding interface circuitry, as discussed above). The audio input device 2318 may include any device that generates a signal representative of a sound, such as microphones, microphone arrays, or digital instruments (e.g., instruments having a musical instrument digital interface (MIDI) output).

The computing device 2300 may include a GPS device 2316 (or corresponding interface circuitry, as discussed above). The GPS device 2316 may be in communication with a satellite-based system and may receive a location of the computing device 2300, as known in the art.

The computing device 2300 may include an other output device 2310 (or corresponding interface circuitry, as discussed above). Examples of the other output device 2310 may include an audio codec, a video codec, a printer, a wired or wireless transmitter for providing information to other devices, or an additional storage device.

The computing device 2300 may include an other input device 2320 (or corresponding interface circuitry, as discussed above). Examples of the other input device 2320 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2300 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2300 may be any other electronic device that processes data.

Select Examples

The following paragraphs provide examples of various ones of the embodiments disclosed herein.

Example 1 provides a transistor electrode-channel arrangement that includes a channel material, S/D electrodes provided over the channel material, and a sealant at least partially enclosing one or more of the S/D electrodes, where the sealant includes one or more metallic conductive materials and is different from the material of the S/D electrodes.

Example 2 provides the transistor electrode-channel arrangement according to Example 1, where the one or more metallic conductive materials include one or more of titanium, aluminum, and tantalum in combination with one or more of oxygen and nitrogen, e.g., one or more of titanium nitride, aluminum titanium nitride, aluminum titanium oxide, tantalum nitride, aluminum tantalum nitride, or aluminum nitride.

Example 3 provides the transistor electrode-channel arrangement according to Examples 1 or 2, where an oxygen permeability coefficient of the sealant is below $10^{-4}$ mol/ms-Pa.

Example 4 provides the transistor electrode-channel arrangement according to any one of Examples 1-3, where a hydrogen permeability coefficient of the sealant is below $10^{-13}$ mol/ms-Pa.

Example 5 provides the transistor electrode-channel arrangement according to any one of Examples 1-3, where a hydrogen permeability coefficient of the sealant (i.e., a total of the materials included in the sealant) is above about $10^{-4}$ mol/ms-Pa.

Example 6 provides the transistor electrode-channel arrangement according to Example 5, where at least about 80% of the sealant (i.e., a total of the materials included in the sealant), e.g., at least about 85%, or at least about 90%, is amorphous.

Example 7 provides the transistor electrode-channel arrangement according to any one of the preceding Examples, where the sealant includes two or more layers of different metallic conductive materials.

Example 8 provides the transistor electrode-channel arrangement according to any one of the preceding Examples, where the sealant has a thickness between about 0.5 and 100 nanometers, including all values and ranges therein, e.g., between about 2 and 50 nanometers, or between about 5 and 25 nanometers.

Example 9 provides the transistor electrode-channel arrangement according to any one of the preceding Examples, where the channel material includes one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, indium gallium zinc oxide, indium telluride, molybdenite, molybdenum diselenide, tungsten diselenide, tungsten disulfide, and black phosphorus.

Example 10 provides the transistor electrode-channel arrangement according to any one of the preceding Examples, where at least a portion of the sealant interfaces the channel material (i.e., is in contact with the channel material, or in contact with an interfacial layer which may be spontaneously formed as a result of providing the material(s) of the sealant on the channel material).

Example 11 provides the transistor electrode-channel arrangement according to any one of the preceding Examples, further including a first S/D contact electrically connected to one of the S/D electrodes and a second S/D contact electrically connected to another one of the S/D electrodes, the first and second S/D contacts comprising different material(s) than the sealant.

A further Example provides the transistor electrode-channel arrangement according to any one of the preceding Examples, further including a contact material, in particular a low contact resistance metal, between at least one of the S/D electrodes and the channel material.

Example 12 provides a transistor that includes a channel material, a gate electrode material, a gate dielectric disposed between the gate electrode material and the channel material, S/D electrodes disposed over the channel material, and a sealant at least partially enclosing at least one of the S/D electrodes, where the sealant includes one or more metallic conductive materials and is different from the material of the S/D electrodes.

Example 13 provides the transistor according to Example 12, where the at least one of the S/D electrodes is between the channel material and the sealant.

Example 14 provides the transistor according to Example 12, where the sealant is between the channel material and the at least one of the S/D electrodes.

Example 15 provides the transistor according to Examples 12 or 13, where the sealant is over at least one sidewall of at least one of the S/D electrodes.

Example 16 provides the transistor according to any one of Examples 12-15, where the sealant wraps around, e.g. completely wraps around, the at least one of the S/D electrodes.

Example 17 provides the transistor according to any one of Examples 12-16, where the sealant is a multilayer sealant.

Example 18 provides the transistor according to any one of Examples 12-17, where the transistor is a single top-gate transistor.

Example 19 provides the transistor according to any one of Examples 12-18, where the transistor is a single bottom-gate transistor.

Example 20 provides the transistor according to any one of Examples 12-19, where the transistor is a multi-gate transistor.

In various further Examples, the channel material, S/D electrodes, and the sealant of the transistor according to any one of Examples 12-20 may be implemented as the transistor electrode-channel arrangement according to any one of Examples 1-11.

Example 21 provides a computing device that includes a substrate and an IC die coupled to the substrate. The IC die includes a transistor having a channel material, S/D electrodes provided over the channel material, and a sealant at least partially enclosing at least one of the S/D electrodes, where the sealant includes one or more metallic conductive materials.

Example 22 provides the computing device according to Example 21, where the computing device is a wearable or handheld computing device.

Example 23 provides the computing device according to Examples 21 or 22, where the computing device further includes one or more communication chips and an antenna.

Another Example provides the computing device according to any one of Examples 21-23, where the substrate is a motherboard.

In various further Examples, the channel material, S/D electrodes, and the sealant of the transistor of the computing device according to any one of Examples 21-23 may be implemented as the transistor electrode-channel arrangement according to any one of the preceding Examples, e.g., any one of Examples 1-11, and/or the transistor of the computing device according to any one of Examples 21-23 may be implemented as the transistor according to any one of the preceding Examples, e.g., any one of Examples 12-20.

Example 24 provides a method of manufacturing a transistor. The method includes providing a channel material, providing S/D electrodes over the channel material, and providing a sealant at least partially enclosing at least one of the S/D electrodes, where the sealant includes one or more metallic conductive materials and is different from the material of the S/D electrodes.

Example 25 provides the method according to Example 24, where the sealant at least partially, but possibly substantially completely, wraps around the at least one of the S/D electrodes.

In various further Examples, the method according to Examples 24 or 25 may further include processes to manufacture the transistor electrode-channel arrangement according to any one of the preceding Examples, the transistor according to any one of the preceding Examples, or/and the computing device according to any one of the preceding Examples.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
   a semiconductor material;
   a transistor comprising an electrode and a gate stack, wherein the electrode is a source electrode or a drain electrode of the transistor, and wherein the gate stack includes a gate dielectric and a gate electrode material; and
   a sealant, wherein at least 80% of the sealant is amorphous, and wherein the electrode is between the semiconductor material and at least a portion of the sealant.

2. The IC device according to claim 1, wherein a hydrogen permeability coefficient of the sealant is above $10^{-4}$ mole per millisecond Pascal.

3. The IC device according to claim 1, wherein the sealant includes one or more metallic conductive materials.

4. The IC device according to claim 1, wherein the sealant is over at least one sidewall of the electrode.

5. The IC device according to claim 1, wherein the sealant wraps around at least a portion of the electrode.

6. The IC device according to claim 1, wherein the sealant has a thickness between 0.5 and 100 nanometers.

7. The IC device according to claim 1, wherein the semiconductor material is a thin-film semiconductor material.

8. The IC device according to claim 1, wherein:
   the IC device is a computing device that includes an IC die, and
   the IC die includes the semiconductor material, the electrode, and the sealant.

9. The IC device according to claim 8, wherein the computing device is a wearable or handheld computing device.

10. The IC device according to claim 8, wherein the computing device further includes one or more communication chips and an antenna.

11. An integrated circuit (IC) device, comprising:
    a transistor comprising a region, wherein the region is either a source region or a drain region of the transistor;
    an electrode coupled to the region;
    a layer comprising two or more layers of different metallic conductive materials, wherein at least a portion of the layer is in physical contact with at least a portion of the electrode, and the layer includes an amorphous material; and a semiconductor material, wherein the electrode is between the semiconductor material and at least a portion of the layer.

12. The IC device according to claim 11, wherein the layer has a thickness between 0.5 and 100 nanometers.

13. The IC device according to claim 11, wherein:
the IC device is an IC package that includes an IC die and a further component coupled to the IC die, and
the IC die includes the transistor, the electrode, and the layer.

14. The IC device according to claim 13, wherein the further component includes one of an interposer, a package substrate, a carrier substrate, a motherboard, or a further IC die.

15. The IC device according to claim 13, wherein the further component is coupled to the IC die by first-level interconnects.

16. The IC device according to claim 11, wherein the layer is over at least one sidewall of the electrode.

17. The IC device according to claim 11, wherein the transistor is a thin-film transistor.

18. An integrated circuit (IC) device, comprising:
a transistor comprising an electrode and a gate stack, wherein the electrode is a source electrode or a drain electrode of the transistor, and wherein the gate stack includes a gate dielectric and a gate electrode material; and a layer adjacent to the electrode, wherein at least 80% of the layer is amorphous, at least a portion of the layer is in physical contact with at least a portion of the electrode, and the layer wraps around at least a portion of the electrode.

19. The IC device according to claim 18, wherein a hydrogen permeability coefficient of the layer is above $10^{-4}$ mole per millisecond Pascal.

20. The IC device according to claim 18, wherein the layer includes one or more metallic conductive materials.

21. The IC device according to claim 18, further comprising:
a semiconductor material,
wherein the electrode is between the semiconductor material and at least a portion of the layer.

22. The IC device according to claim 18, wherein:
the IC device is an IC package that includes an IC die and a further component coupled to the IC die, and
the IC die includes the transistor and the layer.

23. The IC device according to claim 22, wherein the further component includes one of an interposer, a package substrate, a carrier substrate, a motherboard, or a further IC die.

* * * * *